United States Patent
Kim et al.

(10) Patent No.: US 7,811,680 B2
(45) Date of Patent: *Oct. 12, 2010

(54) ORGANIC EL DEVICE AND METHOD OF MANUFACTURING THE SAME

(75) Inventors: Tae-Shick Kim, Suwon-si (KR); Hye-In Jeong, Suwon-si (KR); Young-Mo Koo, Suwon-si (KR); Ok-Keun Song, Suwon-si (KR); Jun-Yeob Lee, Suwon-si (KR); Min-Seung Chun, Suwon-si (KR); Mi-Kyung Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 974 days.

This patent is subject to a terminal disclaimer.

(21) Appl. No.: 11/246,308

(22) Filed: Oct. 11, 2005

(65) Prior Publication Data

US 2006/0076885 A1    Apr. 13, 2006

(30) Foreign Application Priority Data

Oct. 11, 2004 (KR) .............. 10-2004-0081114
Aug. 4, 2005 (KR) .............. 10-2005-0071502

(51) Int. Cl.
*H01L 51/54* (2006.01)

(52) U.S. Cl. .............. 428/690; 428/917; 313/504; 313/506

(58) Field of Classification Search .............. None
See application file for complete search history.

(56) References Cited

U.S. PATENT DOCUMENTS

| | | | |
|---|---|---|---|
| 5,773,929 | A | 6/1998 | Shi et al. |
| 6,392,250 | B1 | 5/2002 | Aziz et al. |
| 6,392,339 | B1 | 5/2002 | Aziz et al. |
| 6,514,649 | B1 | 2/2003 | Sakaguchi |
| 6,562,982 | B1 * | 5/2003 | Hu et al. .............. 548/440 |
| 6,670,053 | B2 | 12/2003 | Conley |

(Continued)

FOREIGN PATENT DOCUMENTS

CN    1441628    9/2003

(Continued)

OTHER PUBLICATIONS

Machine translation of detailed description for JP 05-331458 published Dec. 1993.*

(Continued)

*Primary Examiner*—Dawn Garrett
(74) *Attorney, Agent, or Firm*—H.C. Park & Associates, PLC

(57) ABSTRACT

An organic electroluminescent device is disclosed that includes an emission layer between a first electrode and a second electrode, and a buffer layer between the emission layer and the first electrode. The buffer layer includes a carbon-based compound and may be about 0.1 nm to about 100 nm thick. The organic electroluminescent device has greater driving voltage, better efficiency, and a longer life expectancy.

17 Claims, 3 Drawing Sheets

U.S. PATENT DOCUMENTS

| | | | |
|---|---|---|---|
| 6,670,054 B1 | 12/2003 | Hu et al. | |
| 6,730,929 B2 | 5/2004 | Fukuyama et al. | |
| 6,881,502 B2 | 4/2005 | Liao | |
| 6,929,872 B2 | 8/2005 | Mori et al. | |
| 7,514,863 B2 * | 4/2009 | Lee et al. | 313/504 |
| 2002/0086180 A1 * | 7/2002 | Seo et al. | 428/690 |
| 2003/0189401 A1 | 10/2003 | Kido et al. | |
| 2004/0124504 A1 * | 7/2004 | Hsu | 257/655 |
| 2004/0214041 A1 * | 10/2004 | Lu et al. | 428/690 |
| 2005/0196526 A1 | 9/2005 | Ishida | |
| 2006/0099448 A1 * | 5/2006 | Lu et al. | 428/690 |
| 2006/0105200 A1 * | 5/2006 | Poplavskyy et al. | 428/690 |
| 2006/0251924 A1 * | 11/2006 | Lu et al. | 428/690 |
| 2007/0009762 A1 | 1/2007 | Hamada et al. | |
| 2007/0181887 A1 | 8/2007 | Kijima et al. | |
| 2008/0038583 A1 | 2/2008 | Itai et al. | |

FOREIGN PATENT DOCUMENTS

| | | |
|---|---|---|
| EP | 0 947 123 | 2/2002 |
| EP | 1 339 264 A2 | 8/2003 |
| JP | 05331458 | 12/1993 |
| JP | 10284253 | 10/1998 |
| JP | 2000-150152 | 5/2000 |
| JP | 2000-150170 | 5/2000 |
| JP | 2000-196140 | 7/2000 |
| JP | 2001006878 | 1/2001 |
| JP | 2002324680 | 11/2002 |
| JP | 2003-168569 | 6/2003 |
| JP | 2003272870 | 9/2003 |
| JP | 2004-063408 | 2/2004 |
| JP | 2004-327436 | 11/2004 |
| JP | 2005-166641 | 6/2005 |
| JP | 2006-049394 | 2/2006 |
| JP | 2007-012946 | 1/2007 |
| KR | 2004-0065667 | 7/2004 |
| KR | 2004-082333 | 9/2004 |
| KR | 10-2005-0046624 | 5/2005 |
| KR | 2007-0024036 | 3/2007 |
| KR | 2003-0070846 | 9/2009 |
| TW | 588572 | 5/2004 |
| WO | 02/30159 | 4/2002 |
| WO | 2004/029176 | 4/2004 |
| WO | 2005/064994 | 7/2005 |
| WO | 2005/076753 | 8/2005 |

OTHER PUBLICATIONS

European Search Report dated Feb. 1, 2006.
Keizo Kato, et al., "Organic Light-Emitting Diodes with a Nanostructured Fullerene Layer at the interface between Alq3 and TPD Layers", Japanese Journal of Applied Physics, vol. 42, No. 4b, pp. 2526-2529, Apr. 2003.
Jae-Yoo Kim, et al., "Electrical and Optical Studies of Organic Light Emitting Devices Using SWCNTs-polymer Nanocomposites", Optical Materials, Elsevier Science Publishers B.V. Amsterdam, NL, vol. 21, No. 1-3, pp. 147-151, Jan. 2003.
Patrick Fournet, et al., "A Carbon Nanotube Composite as an Electron-Transport Layer in Organic Light-Emitting Diodes", Conference on Lasers and Electro-Optics (CLEO 2001), Technical Digest, Postconference Edition, MD, US, Trneds in Optics and Photonics (TOPS), WA, US, vol. 56, pp. 34-35, May 2001.
Patrick Fournet, et al., "Enhanced Brightness in Organic Light-Emitting Diodes Using a Carbon Nanotube Composite as an Electron-Transport Layer", Journal of Applied Physics, vol. 90, No. 2, pp. 969-975, Jul. 2001.
Chinese Office Action mailed Aug. 29, 2008.
Office Action issued Aug. 8, 2008 by the State Intellectual Property Office of the People's Republic of China in Chinese Application No. 200610072693.0.
Office Action issued Dec. 11, 2009 by the State Intellectual Property Office of the People's Republic of China in Chinese Application No. 200610169085.1.
Japanese Office Action issued Aug. 25, 2009 in Japanese Application No. 2006-294797.

* cited by examiner

ORGANIC EL DEVICE AND METHOD OF MANUFACTURING THE SAME

CROSS REFERENCE TO RELATED APPLICATION

This application claims priority to and the benefit of Korean Patent Application Nos. 10-2004-0081114, filed on Oct. 11, 2004, and 10-2005-0071502, filed on Aug. 4, 2005, which are hereby incorporated by reference for all purposes as if fully set forth herein.

BACKGROUND OF THE INVENTION

1. Field of the Invention

The present invention relates to an organic electroluminescent device that has a long life expectancy and low power consumption and a method of manufacturing the same.

2. Discussion of the Background

Organic electroluminescent (EL) devices are self-emissive. Electrons and holes combine in an organic layer of an organic EL device to emit light when a voltage is applied to the organic layer interposed between an anode and a cathode. Organic EL devices can be used to form an information display device that is light and thin and also has high resolution, a quick response time, and a wide viewing angle. Organic EL devices are used in an expanding range of applications, including mobile phones, high-end information display devices, and the like.

Organic EL devices have improved to the extent that they now compete with thin film transistor liquid crystalline displays (TFT-LCDs) in industrial and academic markets. Organic EL devices still have many problems that prevent further implementation in the marketplace, including poor efficiency, short life expectancies, and high power consumption. These problems must be solved to improve the organic EL device's commercial utility.

SUMMARY OF THE INVENTION

The present invention provides an organic EL device that includes a buffer layer formed of a carbon-based compound interposed between a first electrode and an emission layer in order to obtain a greater driving voltage and a longer life expectancy regardless of the emission material used. The efficiency and life expectancy of the organic EL device can be improved by controlling the thickness of the buffer layer using the deposition rate of the buffer layer.

The present invention also provides a method of manufacturing the organic EL device that includes forming a buffer layer of a carbon-based compound.

Additional features of the invention will be set forth in the description which follows, and in part will be apparent from the description, or may be learned by practice of the invention.

The present invention discloses an organic electroluminescent device including a first electrode, a buffer layer made of a carbon-based compound on the first electrode, an emission layer on the buffer layer, and a second electrode on the emission layer.

The present invention also discloses an organic electroluminescent device including a first electrode, an emission layer on the first electrode, an electron transport layer on the emission layer, and a second electrode formed on the electron transport layer, where the electron transport layer includes an electron transporting material and a carbon-based compound.

The present invention also discloses a method of manufacturing an organic electroluminescent device where the method includes forming a buffer layer including a carbon-based compound to a thickness of about 0.1 nm to about 100 nm on a first electrode, forming an emission layer on the buffer layer, and forming a second electrode on the emission layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE INVENTION

Figure 1:
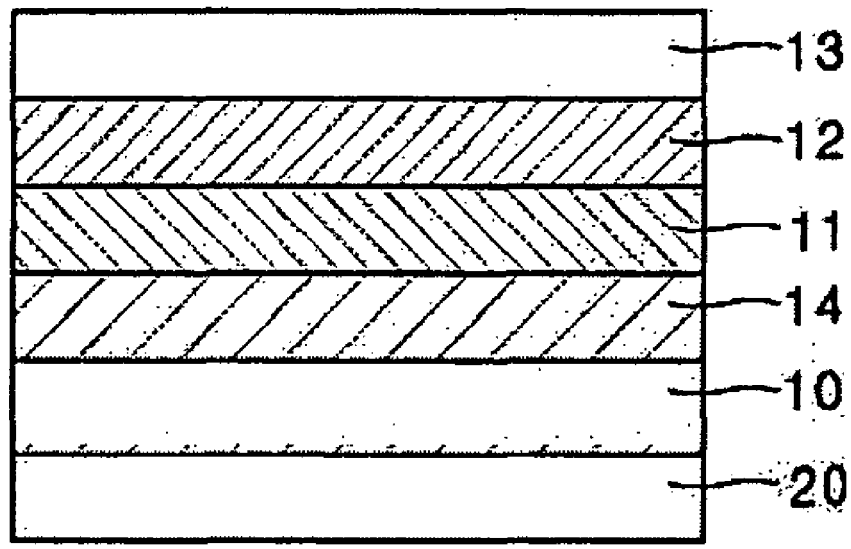
FIG. 1, FIG. 2, FIG. 3, FIG. 4, and FIG. 5 are sectional views of organic EL devices according to exemplary embodiments of the present invention.

An organic electroluminescent (EL) device according to an exemplary embodiment of the present invention includes an emission layer interposed between a first electrode and a second electrode, and a carbon-based buffer layer interposed between the first electrode and the emission layer.

The organic EL device may include a hole injection layer between the first electrode (anode) and the emission layer. In this structure, the buffer layer can be formed between the first electrode and the hole injection layer, between the hole injection layer and the emission layer, or between both the first electrode and the hole injection layer and between the hole injection layer and the emission layer.

The organic EL device may include a hole transport layer interposed between the first electrode and the emission layer. In this structure, the buffer layer can be formed between the first electrode and the hole transport layer, between the hole transport layer and the emission layer, or between both the first electrode and the hole transport layer and between the hole transport layer and the emission layer.

The organic EL device may include the hole injection layer and the hole transport layer sequentially formed between the first electrode and the emission layer. In this structure, the buffer layer can be formed between one or more of the first electrode and the hole injection layer, the hole injection layer and the hole transport layer, and the hole transport layer and the emission layer.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

A buffer layer made of a carbon-based compound formed between the first electrode and the emission layer does not change the morphology or the color coordinate of the organic EL device. The buffer layer does change the intersurface energy band gap between the ITO electrode used as the first electrode and the hole injection layer so that holes can be more easily injected into the hole injection layer from the ITO electrode. This decreases the driving voltage. Additionally, the buffer layer between the ITO electrode as the first electrode and the hole injection layer increases the life expectancy of the organic EL device.

The buffer layer may be about 0.1 to about 100 nm thick, preferably about 1 to about 10 nm thick, and more preferably about 5 to about 8 nm thick. The characteristics of the organic EL device are not improved when the buffer layer is less than 0.1 nm thick. When the buffer layer is greater than 100 nm thick, characteristics of the organic electroluminescent device such as life expectancy and contrast are improved, but the width of the driving voltage drop is saturated, or the width of voltage gain is reduced.

The organic EL device according to an exemplary embodiment of the present invention includes a buffer layer formed of a carbon-based compound interposed between the first electrode and the hole injection layer, between the hole injection layer and the hole transport layer, and/or between the first electrode and the hole transport layer. The hole injection layer and/or the hole transport layer may be doped with the carbon-based compound.

In another exemplary embodiment, the organic EL device includes a buffer layer interposed between the first electrode and the hole injection layer, between the first electrode and the hole transport layer, and/or between the hole injection layer and the hole transport layer. The hole injection layer and/or the hole transport layer may be doped with the carbon-based compound.

In another exemplary embodiment, the organic EL device includes an electron transport layer doped with the carbon-based compound.

In another exemplary embodiment, the organic EL device includes a buffer layer interposed between the first electrode and the hole injection layer, between the first electrode and the hole transport layer, and/or between the hole injection layer and the hole transport layer. An electron transport layer may be doped with the carbon-based compound.

Figure 6:
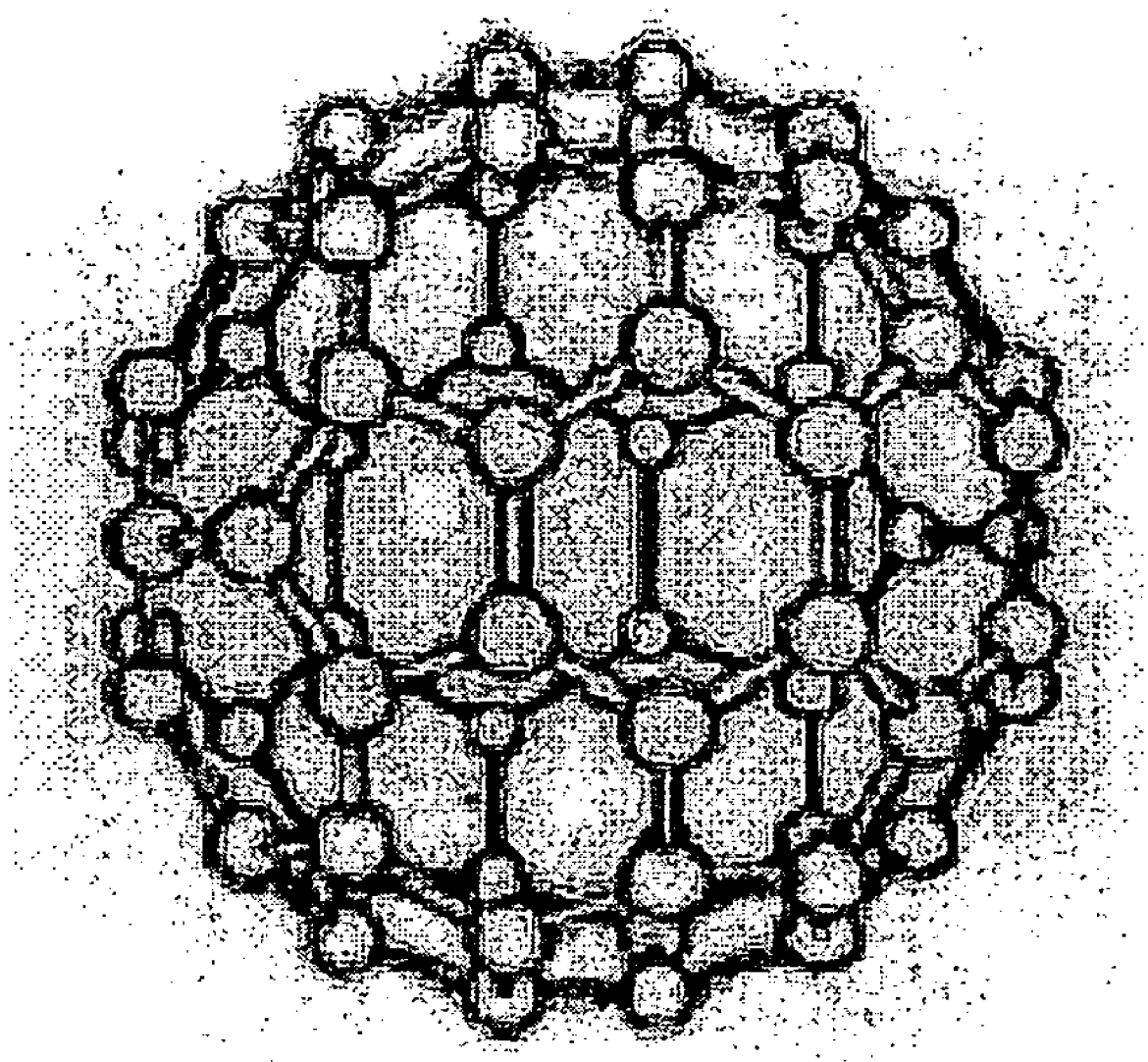
FIG. 6 shows a structure of $C_{60}$ fullerene that is used in an exemplary embodiment of the present invention.

The carbon-based compound may include, but is not limited to, a carbon-based compound containing a metal. The carbon-based compound may be a carbon allotrope containing 60 to 500 carbons containing a metal. The carbon-based compound may include at least one compound or at least two compounds selected from fullerene, fullerene containing a metal, carbon nano-tubes, carbon fiber, carbon black, graphite, carbine, $MgC_{60}$, $CaC_{60}$, and $SrC_{60}$. In an exemplary embodiment, the carbon-based compound is fullerene that has the structure illustrated in FIG. 6.

Fullerene (also known as buckyballs) is produced by irradiating graphite with a strong laser in a vacuum so that carbon atoms are separated from the surface of the graphite and combined to form a new structure. Examples of fillerene include $C_{60}$, $C_{70}$, $C_{76}$, $C_{84}$, and the like.

In an exemplary embodiment, the buffer layer between the ITO electrode used as the anode and the hole injection layer includes the carbon-based compound, and the hole injection layer and/or the hole transport layer may be doped with the carbon-based compound. In another exemplary embodiment, the buffer layer between the ITO electrode used as the anode and the hole injection layer includes the carbon-based compound and the electron transport layer may be doped with the carbon-based compound. The hole injection layer, hole transport layer, or electron transport layer may be doped with the carbon-based compound to an amount in the range of about 0.005 to about 99.95 parts by weight based on 100 parts by weight of the layer. It is possible to dope the hole injection layer, the hole transport layer, and the electron transport in the same device. The improvement of the organic EL device characteristics is negligible when the amount of the carbon-based compound dopant is outside this range.

FIG. 1, FIG. 2, FIG. 3, FIG. 4, and FIG. 5 are sectional views of organic EL devices according to exemplary embodiments of the present invention.

Referring to FIG. 1, an organic EL device includes a substrate 20 and a first electrode 10, a buffer layer 14 made of a carbon-based compound, a hole injection layer 11, an emission layer 12, and a second electrode 13 sequentially deposited on the substrate 20. The hole injection layer 11 may be doped with the carbon-based compound.

Figure 2:
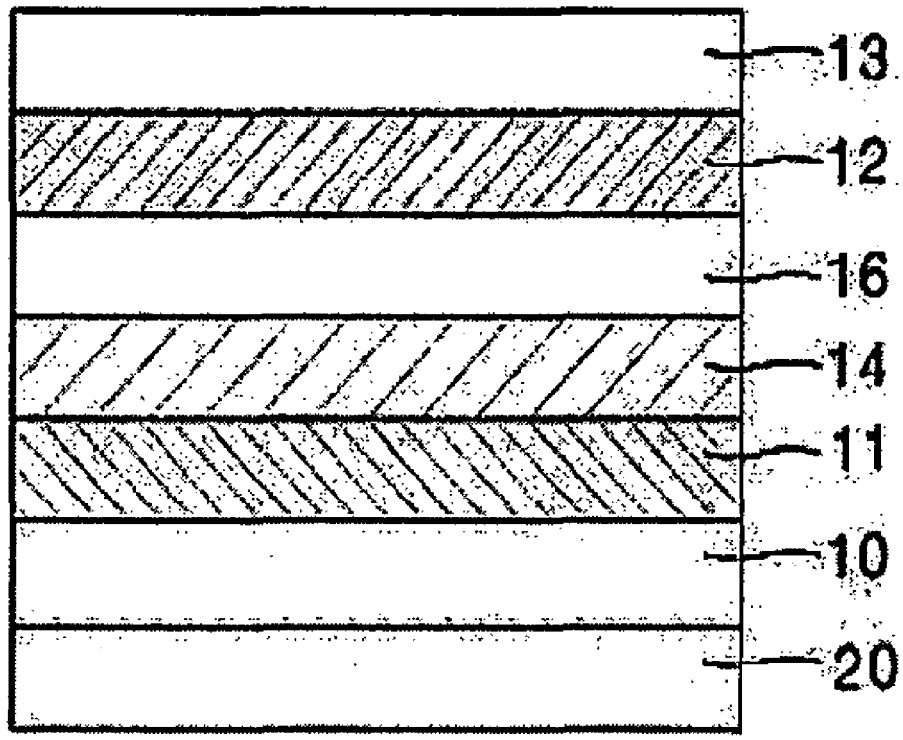

Referring to FIG. 2, an organic EL device includes a substrate 20 and a first electrode 10, a hole injection layer 11, a buffer layer 14 made of a carbon-based compound, a hole transport layer 16, an emission layer 12, and a second electrode 13 sequentially deposited on the substrate 20.

Figure 3:
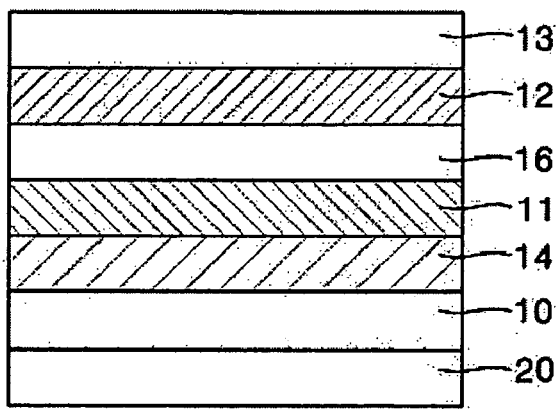

The organic EL device illustrated in FIG. 3 has the same structure as the organic EL device illustrated in FIG. 1, except that a hole transport layer 16 is interposed between the hole injection layer 11 and the emission layer 12.

Figure 4:
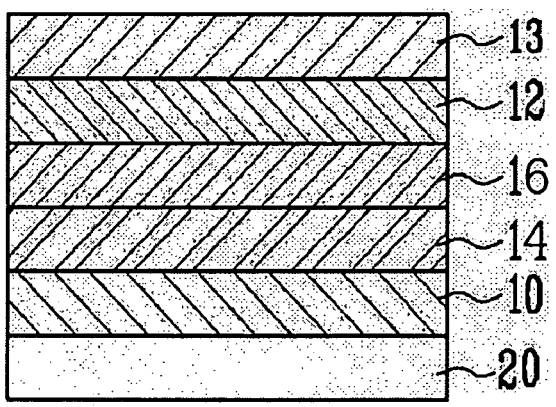

The organic EL device illustrated in FIG. 4 includes a substrate 20 and a first electrode 10, a buffer layer 14 made of a carbon-based compound, a hole transport layer 16, an emission layer 12, and a second electrode 13 sequentially deposited on the substrate 20.

Figure 5:
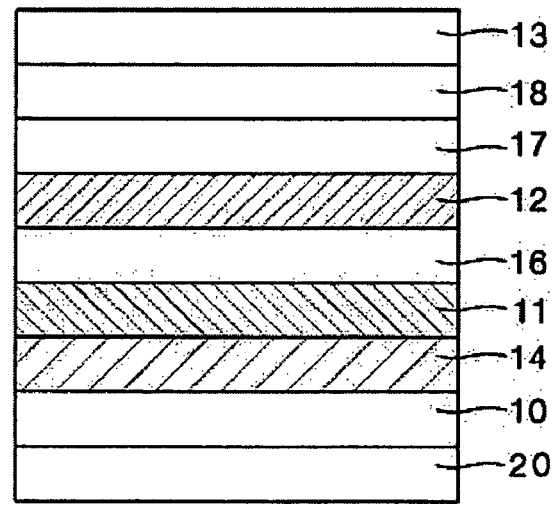

The organic EL device illustrated in FIG. 5 has the same structure as the organic El device illustrated in FIG. 3, except that an electron transport layer 17 and an electron injection layer 18 are sequentially deposited between the emission layer 12 and the second electrode 13. The hole injection layer 11 and/or the hole transport layer 16 may be doped with a carbon-based compound. Alternatively, the electron transport layer 17 may be doped with a carbon-based compound.

The organic EL devices according to exemplary embodiments of the present invention may further include an intermediate layer to improve interface characteristics between layers or a hole blocking layer.

A method of manufacturing an organic EL device according to an embodiment of the present invention illustrated in FIG. 5 will now be described.

A patterned first electrode 10 is deposited on a substrate 20. The substrate may be a substrate used in a conventional organic EL device, including a glass substrate or a transparent plastic substrate. The substrate should have a smooth surface and be transparent, waterproof, and easily treated. The substrate may have a thickness of about 0.3 to about 1.1 mm.

The first electrode 10 is formed of a conducting metal or an oxide of a conducting metal so that holes can be easily injected onto the first electrode 10. The material used may be Indium Tin Oxide (ITO), Indium Zinc Oxide (IZO), Ni, Pt, Au, Ir, or the like.

The resulting product is cleaned with an organic solvent, such as isopropanol (IPA) and acetone, and then is subject to an UV/ozone treatment.

A buffer layer 14 is formed on the first electrode 10 using any conventional method, such as a deposition method. The buffer layer 14 is made of at least one carbon-based compound selected from the group of fullerene, a fullerene-based complex compound containing a metal, carbon nano-tubes, carbon fiber, carbon black, graphite, carbine, $MgC_{60}$, $CaC_{60}$, and $SrC_{60}$. In an exemplary embodiment, the carbon-based compound may be fullerene.

The buffer layer 14 may be deposited to be about 1 nm to about 10 nm thick at a deposition rate of about 0.01 nm/s to about 0.2 nm/s under a vacuum. When the buffer layer 14 is deposited about 1 nm to about 5 nm thick, the deposition rate may be about 0.01 nm/s to about 0.05 nm/s. When the buffer layer 14 is deposited about 5 nm to about 10 nm thick, the deposition rate may be about 0.05 nm/s to about 0.2 nm/s. The deposition rate affects the efficiency and life expectancy of the organic EL device, due to a small change of the morphology.

A hole injection material is vacuum-thermally deposited or spin coated on the buffer layer 14 to form a hole injection layer 11. The hole injection layer 11 decreases the contact resistance and increases the hole transporting ability between the first electrode 10 and an emission layer. This decreases the driving voltage and increases the life expectancy of the organic EL device.

The hole injection layer 11 may be about 30 nm to about 150 nm thick. When the hole injection layer 11 is less than 30 nm thick, the lifetime and reliability of the organic EL device is reduced, and an undesirable resolution short may occur in a passive matrix type organic EL device. The driving voltage of the device increases when the hole injection layer 11 is more than 150 nm thick.

The hole injection layer 11 may be formed of copper phthalocyanine (CuPc) or a starburst-type amine, such as TCTA, m-MTDATA, or IDE406 (obtained from Idemitz Co.). The hole injection layer 11 may be formed of other materials.

[Formula 3]

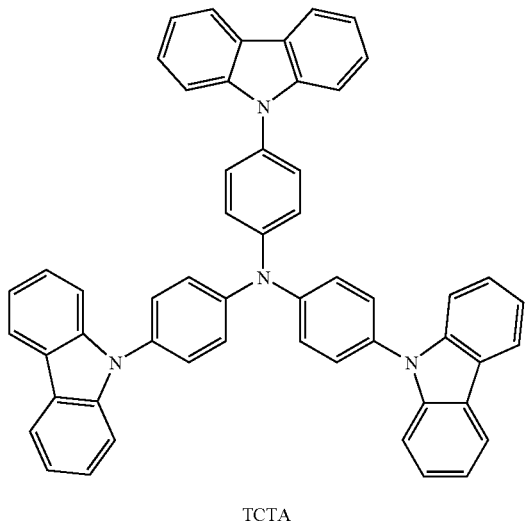

TCTA

-continued

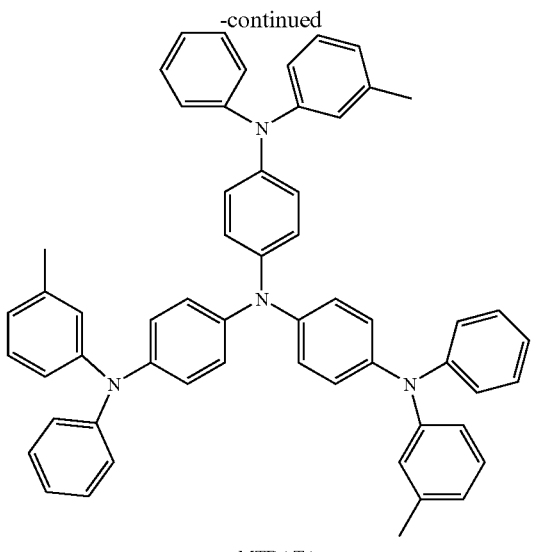

m-MTDATA

A hole transport layer 16 is vacuum-thermally deposited or spin coated on the hole injection layer 11. The hole transport layer may include, but is not limited to N,N'-bis(3-methylphenyl)-N,N'-diphenyl-[1,1-biphenyl]-4,4'-diamine (TPD); N,N'-di(naphthalene-1-yl)-N,N'-diphenylbenzidine (α-NPD); IDE320 (obtained from Idmitz Co.). The hole transport layer 16 may be about 10 nm to about 40 nm thick. The hole transporting ability decreases when the hole transport layer 16 is less than about 10 nm thick. The driving voltage of the device increases when the hole transport layer 16 is more than 40 nm thick.

[Formula 4]

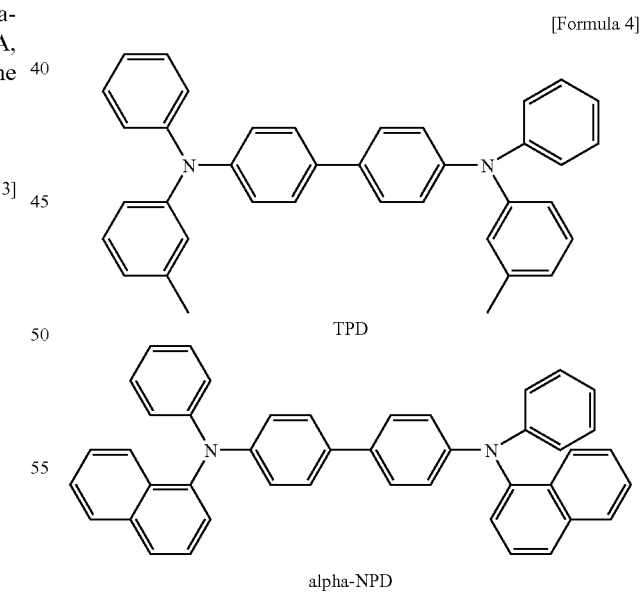

TPD alpha-NPD

An emission layer 12 is formed on the hole transport layer 16 by vacuum-thermal deposition or spin coating. The emission layer 12 may include complex compounds of Al, such as Alq3(tris(8-quinolinolato)-aluminium), BAlq, Salq, and Almq3, complex compounds of Ga, such as $Gaq'_2OPiv$, $Gaq'_2OAc$, and $2(Gaq'_2)$, fluorine, polyparaphenylene vinylene or a derivative thereof, a biphenyl derivative, and a spiro polyfluorene-based polymer.

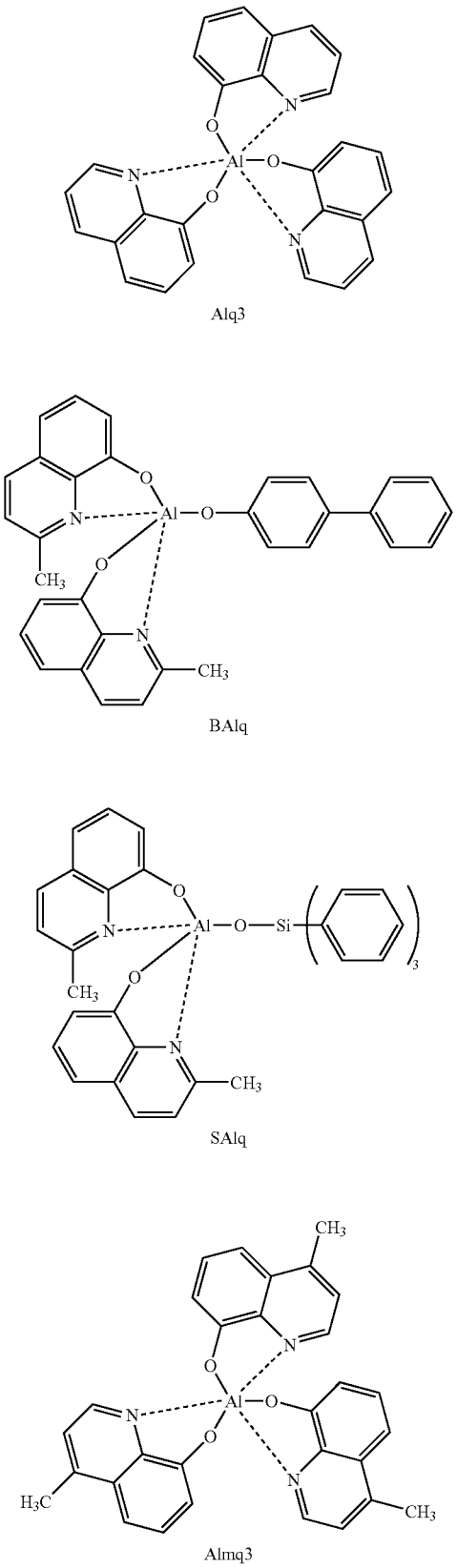

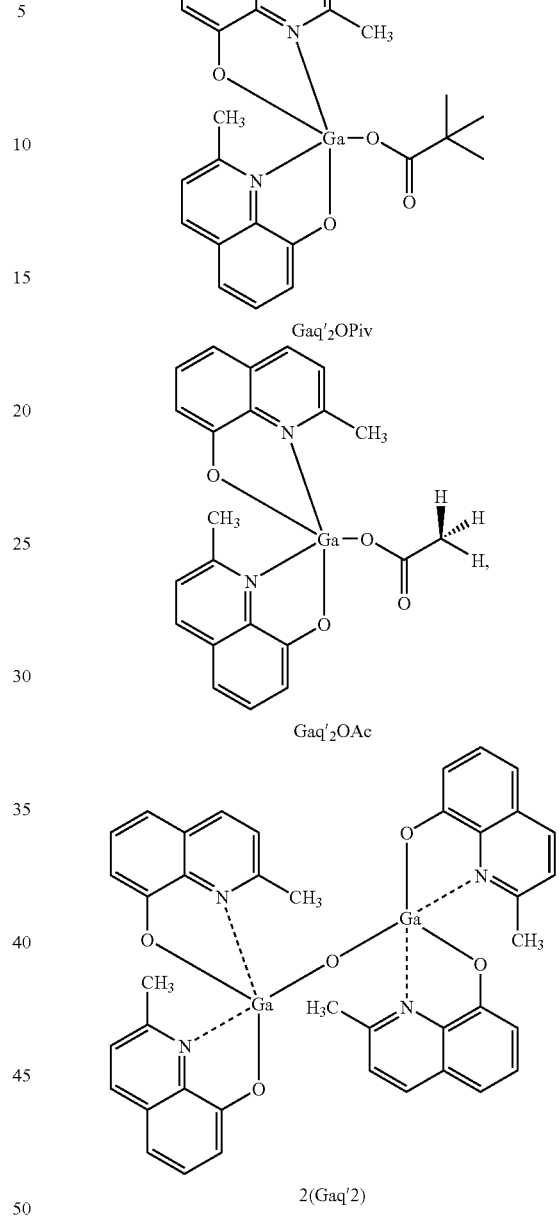

The emission layer 12 may be about 15 nm to about 60 nm thick, preferably about 30 nm to about 50 nm thick. The driving voltage of the device increases as the emission layer 12 becomes thicker. The emission layer 12 cannot be thicker than 60 nm.

A hole blocking layer (not shown in FIG. 5) may be formed on the emission layer 12. The hole blocking layer may be formed by vacuum-deposition or spin-coating. The hole blocking layer may have an electron transporting ability and an ionization potential greater than that of the emission layer 12. The hole blocking material may be, but is not limited to, bis(2-methyl-8-quinolato)-(p-phenylphenolato)-aluminum (Balq), bathocuproine(BCP), tris(N-arylbenzimidazole) (TPBI). The hole blocking layer may be about 3 nm to about 7 nm thick. The hole blocking ability is weak when the hole blocking layer is thinner than 3 nm. The driving voltage of the device increases when the thickness of the hole blocking layer is thicker than 7 nm.

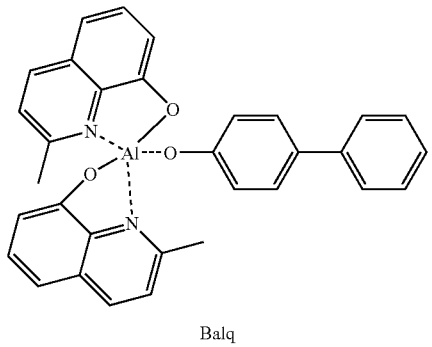

Balq

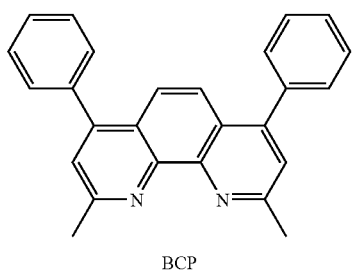

BCP

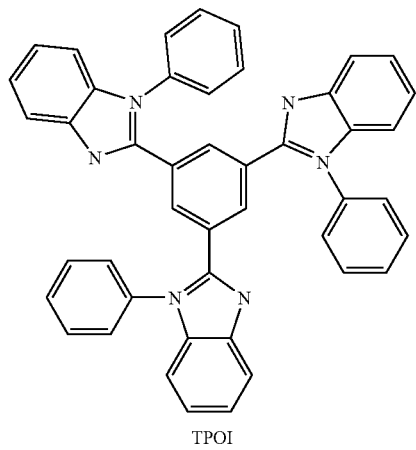

TPOI

An electron transport layer 17 is formed on the emission layer 12 by vacuum-deposition or spin-coating. The electron transporting material may be, but is not limited to, Alq3.

The electron transport layer 17 may be about 15 nm to about 60 nm thick. The electron transporting ability decreases when the electron transport layer 17 is thinner than 15 nm. The driving voltage increases when the electron transport layer 17 is thicker than 60 nm.

An electron injection layer 18 may be formed on the electron transport layer 17. The electron injection layer 18 may include LiF, NaCl, CsF, Li$_2$O, BaO, Liq, or the like. The electron injection layer 18 may be about 0.5 nm to about 2 nm thick. The electron injecting ability decreases when the electron injection layer 18 is thinner than about 0.5 nm. The driving voltage increases when the electron injection layer 18 is thicker than about 2 nm.

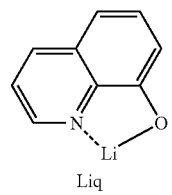

Liq

A cathode is vacuum-thermally deposited on the electron injection layer 18. The cathode serves as the second electrode 13. The cathode may include Li, Mg, Al, Al—Li, Ca, Mg—In, Mg—Ag, or the like.

The hole injection layer 11 and/or the hole transport layer 16 may be doped with the carbon-based compound. Alternatively, the electron transport layer 17 may be doped with the carbon-based compound. The doped layer is formed by vacuum-thermally co-depositing the respective layer material described above with the carbon-based compound. The amount of the carbon-based compound may be about 0.005 to about 99.95 parts by weight based on 100 parts by weight of the respective layer.

The present invention will now be described in further detail with reference to the following examples. The following examples are for illustrative purposes and are not intended to limit the scope of the present invention.

EXAMPLE 1

A 15 Ω/cm$^2$(120 nm) glass substrate from Corning Co. was cut to 50 mm×50 mm×0.7 mm, cleaned using ultrasonic waves in isopropyl alcohol for 5 minutes, then cleaned using ultrasonic waves in pure water for 5 minutes, and then cleaned using UV and ozone for 30 minutes. The resulting substrate was used as an anode. The cleaned ITO glass substrate was subjected to a plasma treatment at a pressure of 0.1 mTorr for 9 minutes.

Buckminster fullerene (C$_{60}$) was thermally deposited on the substrate at a pressure of $10^{-6}$ torr at a deposition rate of 0.01 nm/s to form a buffer layer, 3 nm thick. IDE406 (obtained from Idemitz Co.) was vacuum-thermally deposited on the buffer layer to form a hole injection layer, 70 nm thick. NPD was vacuum-thermally deposited on the hole injection layer to form a hole transport layer, 15 nm thick.

Alq3 doped with C545T was vacuum-thermally deposited on the hole transport layer to form a green emission layer, about 35 nm thick. Alg3, an electron transporting material, was deposited on the emission layer to form an electron transport layer, 25 nm thick.

LiF was vacuum deposited on the electron transport layer to form an electron injection layer, 1 nm thick. Al was deposited on the electron injection layer to form a cathode, 80 nm thick, to complete a LiF/Al electrode.

EXAMPLE 2

A 15 Ω/cm$^2$(120 nm) glass substrate from Corning Co was cut 50 mm×50 mm×0.7 mm, cleaned using ultrasonic waves in isopropyl alcohol for 5 minutes, then cleaned using ultrasonic waves in pure water for 5 minutes, and then cleaned using UV and ozone for 30 minutes. The resulting substrate was used as an anode. The cleaned ITO glass substrate was subjected to a plasma treatment at a pressure of 0.1 mTorr for 9 minutes.

Buckminster fullerene ($C_{60}$) was thermally deposited on the substrate at a pressure of $10^{-6}$ torr at a deposition rate of 0.05 nm/s to form a buffer layer, 3 nm thick. NPD was vacuum-thermally deposited on the buffer layer to form a hole transport layer, 15 nm thick.

Alq3 doped with C545T was vacuum-thermally deposited on the hole transport layer to form a green emission layer, about 35 nm thick. Alg3, an electron transporting material, was deposited on the emission layer to form an electron transport layer, 25 nm thick.

LiF was vacuum deposited on the electron transport layer to form an electron injection layer, 1 nm thick. Al was deposited on the electron injection layer to form a cathode, 80 nm thick, to complete a LiF/Al electrode.

EXAMPLE 3

An organic EL device was manufactured in the same manner as in Example 1, except that the buffer layer was deposited at a deposition rate of 0.1 nm/s to 3 nm thick.

EXAMPLE 4

An organic EL device was manufactured in the same manner as in Example 2, except that the buffer layer was deposited at a deposition rate of 0.2 nm/s to 3 nm thick.

EXAMPLE 5

An organic EL device was manufactured in the same manner as in Example 1, except that the buffer layer was deposited at a deposition rate of 0.01 nm/s to 7 nm thick.

EXAMPLE 6

An organic EL device was manufactured in the same manner as in Example 2, except that the buffer layer was deposited at a deposition rate of 0.05 nm/s to 7 nm thick.

EXAMPLE 7

An organic EL device was manufactured in the same manner as in Example 1, except that the buffer layer was deposited at a deposition rate of 0.1 nm/s to 7 nm thick.

EXAMPLE 8

An organic EL device was manufactured in the same manner as in Example 2, except that the buffer layer was deposited at a deposition rate of 0.2 nm/s to 7 nm thick.

EXAMPLE 9

An organic EL device was manufactured in the same manner as in Example 1, except that the buffer layer was deposited at a deposition rate of 0.05 nm/s to 15 nm thick.

EXAMPLE 10

An organic EL device was manufactured in the same manner as in Example 2, except that the buffer layer was deposited at a deposition rate of 0.05 nm/s to 15 nm thick.

EXAMPLE 11

An organic EL device was manufactured in the same manner as in Example 1, except that the buffer layer was deposited at a deposition rate of 0.05 nm/s to 30 nm thick.

EXAMPLE 12

An organic EL device was manufactured in the same manner as in Example 2, except that the buffer layer was deposited at a deposition rate of 0.3 nm/s to 30 nm thick.

Driving voltages, efficiencies (current densities), and half-lives of the organic EL devices manufactured according to Examples 1 through 12 were measured using the methods listed below, and the results are shown in Table 1.

Brightness (luminance) was measured using BM5A from Topcon Co. Driving voltages were measured using a 238 High-Current Source-Measure Unit from Keithley Co. Current density was measured by measuring nine or more points on the respective devices while the direct current (DC) was increased by 10 mA/cm$^2$ in the range of 10 mA/cm$^2$ to 100 mA/cm$^2$.

Half-lives were measured by measuring the time before the initial luminance of the respective organic EL devices was decreased by 50% at DC 50 mA/cm$^2$. Reproducibility was measured using at least three of the same devices.

TABLE 1

| | Deposition Rate | Buffer Layer | Driving Voltage | Efficiency | Half-life (h) |
|---|---|---|---|---|---|
| Example 1 | 0.01 | 3 | 6.3 | 14 | 1500 |
| Example 2 | 0.05 | 3 | 6.2 | 13 | 1500 |
| Example 3 | 0.1 | 3 | 6.1 | 13 | 1000 |
| Example 4 | 0.2 | 3 | 6.0 | 12 | 1000 |
| Example 5 | 0.01 | 7 | 9.2 | 17 | 1100 |
| Example 6 | 0.05 | 7 | 8.4 | 16 | 1000 |
| Example 7 | 0.1 | 7 | 6.1 | 14 | 1500 |
| Example 8 | 0.2 | 7 | 6.0 | 14 | 1500 |
| Example 9 | 0.05 | 15 | 9.4 | 14 | 900 |
| Example 10 | 0.05 | 25 | 10.2 | 16 | 900 |
| Example 11 | 0.05 | 30 | 11.0 | 15 | 900 |
| Example 12 | 0.3 | 30 | 10.9 | 15 | 900 |

Referring to Table 1, organic EL devices of Examples 1 through 8 had smaller driving voltages, better luminous efficiency, and longer half-lives than organic EL devices of Examples 9 through 12.

EXAMPLE 13

A glass substrate with an ITO electrode (obtained from Corning Co., surface resistance 15 Ω/cm$^2$, thickness 120 nm) was cut to 50 mm×50 mm×0.7 mm, cleaned using ultrasonic waves in isopropyl alcohol for 5 minutes, then cleaned using ultrasonic waves in pure water for 5 minutes, and then cleaned using UV and ozone for 30 minutes. The resulting substrate was used as an anode. The cleaned ITO glass substrate was subjected to a plasma treatment at a pressure of 0.1 mTorr for 9 minutes.

Buckminster fullerene was vacuum-thermally deposited on the plasma-treated substrate to form a buffer layer, 1 nm thick. IDE406 (obtained from Idemitz Co.) was vacuum-thermally deposited on the buffer layer to form a hole injection layer, 70 nm thick. NPD was vacuum-thermally deposited on the hole injection layer to form a hole transport layer, 15 nm thick.

IDE140 (Idemitz Co.) was vacuum-thermally deposited on the hole transport layer to form a blue emission layer, about 30 nm thick. Alg3, an electron transporting material, was deposited on the emission layer to form an electron transport layer, 25 nm thick.

LiF was vacuum deposited on the electron transport layer to form an electron injection layer, 1 nm thick. Al was deposited on the electron injection layer to form a cathode, 80 nm thick, to complete a LiF/Al electrode. As a result, an organic EL device was manufactured.

EXAMPLE 14

An organic EL device was manufactured in the same manner as in Example 13, except that the buffer layer was 2 nm thick.

EXAMPLE 15

An organic EL device was manufactured in the same manner as in Example 13, except that the buffer layer was 3.5 nm thick.

EXAMPLE 16

An organic EL device was manufactured in the same manner as in Example 13, except that the buffer layer was 5 nm thick.

EXAMPLE 17

An organic EL device was manufactured in the same manner as in Example 13, except that the buffer layer was 6.5 nm thick.

EXAMPLE 18

An organic EL device was manufactured in the same manner as in Example 13, except that the buffer layer was 8 nm thick.

EXAMPLE 19

A glass substrate with an ITO electrode (obtained from Corning Co., surface resistance 15 $\Omega/cm^2$, thickness 120 nm) was cut to 50 mm×50 mm×0.7 mm, cleaned using ultrasonic waves in isopropyl alcohol for 5 minutes, then cleaned using ultrasonic waves in pure water for 5 minutes, and then cleaned using UV and ozone for 30 minutes. The resulting substrate was used as an anode. The resultant ITO glass substrate was subjected to a plasma treatment at a pressure of 0.1 mTorr and less for 9 minutes.

Buckminster fullerene was vacuum-thermally deposited on the plasma-treated substrate to form a buffer layer, 5 nm thick. IDE406 (obtained from Idemitz Co.) was vacuum-thermally deposited on the buffer layer to form a hole injection layer, 70 nm thick. NPD was vacuum-thermally deposited on the hole injection layer to form a hole transport layer, 15 nm thick.

C545T and Alq3 were co-deposited on the hole transport layer to form a green emission layer, 35 nm thick. Alq3, an electron transporting material, was deposited on the green emission layer to form an electron transport layer, 25 nm thick.

LiF was vacuum deposited on the electron transport layer to form an electron injection layer 1 nm thick. Al was deposited on the electron injection layer to form a cathode, 100 nm thick, to complete a LiF/Al electrode.

EXAMPLE 20

An organic EL device was manufactured in the same manner as in Example 19, except that the buffer layer was 6.5 nm thick.

EXAMPLE 21

An organic EL device was manufactured in the same manner as in Example 19, except that the buffer layer was 8 nm thick.

EXAMPLE 22

A glass substrate with an ITO electrode (obtained from Corning Co., surface resistance 15 $\Omega/cm^2$, thickness 120 nm) was cut to 50 mm×50 mm×0.7 mm, cleaned using ultrasonic waves in isopropyl alcohol for 5 minutes, then cleaned using ultrasonic waves in pure water for 5 minutes, and then cleaned using UV and ozone for 30 minutes. The resulting substrate was used as an anode. The resultant ITO glass substrate was subjected to a plasma treatment at a pressure of 0.1 mTorr and less for 9 minutes.

Buckminster fullerene was vacuum-thermally deposited on the plasma-treated substrate to form a buffer layer, 5 nm thick. IDE406 (obtained from Idemitz Co.) was vacuum-thermally deposited on the buffer layer to form a hole injection layer, 70 nm thick. NPD was vacuum-thermally deposited on the hole injection layer to form a hole transport layer, 15 nm thick.

DCJTB and Alq3 were co-deposited on the hole transport layer to form a red emission layer, about 35 nm thick. Alq3, an electron transporting material, was deposited on the red emission layer to form an electron transport layer, 25 nm thick.

LiF was vacuum deposited on the electron transport layer to form an electron injection layer, 1 nm thick. Al was deposited on the electron injection layer to form a cathode, 100 nm thick, to complete a LiF/Al electrode.

EXAMPLE 23

An organic EL device was manufactured in the same manner as in Example 19, except that the buffer layer was 6.5 nm thick.

EXAMPLE 24

An organic EL device was manufactured in the same manner as in Example 19, except that the buffer layer was 8 nm thick.

COMPARATIVE EXAMPLE 1

An organic EL device was manufactured in the same manner as in Example 13, except that no buffer layer was formed.

COMPARATIVE EXAMPLE 2

An organic EL device was manufactured in the same manner as in Example 19, except that no buffer layer was formed.

COMPARATIVE EXAMPLE 3

An organic EL device was manufactured in the same manner as in Example 22, except that no buffer layer was formed.

Driving voltages, efficiencies, and half-lives of the organic EL devices manufactured according to Examples 13 through 18 and Comparative Example 1 were measured. The results are shown in Table 2 below.

Brightness (luminance) was measured using BM5A from Topcon Co. Driving voltages were measured using a 238 High-Current Source-Measure Unit from Keithley Co. Current density was measured by measuring nine or more points on the respective devices while the direct current (DC) was increased by 10 mA/cm² in the range of 10 mA/cm² to 100 mA/cm². Reproducibility was measured using at least nine of the same devices, and the deviations of the brightness and current density were 5% or less.

Half-lives were measured by measuring the time before the initial luminance of the respective organic EL devices was decreased by 50% at DC 50 mA/cm². Reproducibility of the half-lives of at least three devices having the same structure were measured.

TABLE 2

|  | Comparative Example 1 | Example 13 | Example 14 | Example 15 | Example 16 | Example 17 | Example 18 |
| --- | --- | --- | --- | --- | --- | --- | --- |
| Thickness of buffer layer (nm) | 0 | 1.0 | 2.0 | 3.5 | 5.0 | 6.5 | 8.0 |
| Driving voltage (V) | 9.06 | 7.76 | 7.39 | 7.22 | 7.13 | 6.99 | 6.9 |
| Efficiency (cd/A) | 10.48 | 9.64 | 9.48 | 9.56 | 9.93 | 9.56 | 9.61 |
| Half-life (h) | 600 | 800 | 750 | 750 | 850 | 940 | 800 |

Referring to Table. 2, the efficiencies of the organic EL devices of Examples 13 through 18 were almost equal to the efficiency of the organic EL device of Comparative Example 1. The driving voltages of the organic EL devices of Examples 13 through 18 were only about 80% of the driving voltage of the organic EL device of Comparative Example 1. The half-lives of the organic EL devices of Examples 13 through 18 were 50% longer than the half-life of the organic EL device of Comparative Example 1.

The driving voltages, efficiencies, and half-lives of the organic EL devices of Examples 19 through 21 and Comparative Example 2 were measured. The results are shown in Table 3.

TABLE 3

|  | Comparative Example 2 | Example 19 | Example 20 | Example 21 |
| --- | --- | --- | --- | --- |
| Thickness of buffer layer (nm) | 0 | 5.0 | 6.5 | 8.0 |
| Driving voltage (V) | 9.6 | 7.6 | 7.52 | 7.61 |
| Efficiency (cd/A) | 23.66 | 21.59 | 21.95 | 22.06 |
| Half-life (h) | 650 | 750 | 820 | 720 |

Referring to Table. 3, the efficiencies of the organic EL devices of Examples 19 through 21 were almost equal to the efficiency of the organic EL device of Comparative Example 2. The driving voltages of the organic EL devices of Examples 19 through 21 were only about 80% of the driving voltage of the organic EL device of Comparative Example 2. The half-lives of the organic EL devices of Examples 19 through 21 were about 25% longer than the half-life of the organic EL device of Comparative Example 2.

The driving voltages, efficiencies, and half-lives of the organic EL devices of Examples 22 through 24 and Comparative Example 3 were measured. The results are shown in Table 4.

TABLE 4

|  | Comparative Example 3 | Example 22 | Example 23 | Example 24 |
| --- | --- | --- | --- | --- |
| Thickness of buffer layer (nm) | 0 | 5.0 | 6.5 | 8.0 |
| Driving voltage (V) | 7.61 | 5.78 | 5.72 | 5.77 |
| Efficiency (cd/A) | 5.62 | 5.16 | 5.65 | 4.98 |
| Half-life (h) | 1500 | 1800 | 1800 | 1500 |

Referring to Table 4, the efficiencies of the organic EL devices of Examples 22 through 24 were almost equal to the efficiency of the organic EL device of Comparative Example 3. The driving voltages of the organic EL devices of Examples 22 through 24 were only about 80% of the driving voltage of the organic EL device of Comparative Example 3. The half-lives of the organic EL devices of Examples 22 through 24 were 20% longer than the half-life of the organic EL device of Comparative Example 3.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
a first electrode;
a buffer layer comprised of a carbon-based compound on the first electrode;
an emission layer on the buffer layer;
a hole injection layer between the first electrode and the emission layer; and
a second electrode on the emission layer,
wherein the buffer layer is 0.1 nm to 100 nm thick,
wherein the carbon-based compound includes fullerene,
wherein the buffer layer is between the first electrode and the hole injection layer or between the hole injection layer and the emission layer, and
wherein the hole injection layer includes the carbon-based compound in the range of about 0.005 to about 99.95 parts by weight based on 100 parts by weight of the hole injection layer.

2. The organic electroluminescent device of claim 1,
wherein the buffer layer is between the first electrode and the hole injection layer.

3. The organic electroluminescent device of claim 1, further comprising:
a hole transport layer between the first electrode and the emission layer,
wherein the buffer layer is between the first electrode and the hole transport layer or between the hole transport layer and the emission layer.

4. The organic electroluminescent device of claim 3, wherein the buffer layer is between the first electrode and the hole transport layer.

5. The organic electroluminescent device of claim 4, wherein the hole transport layer includes the carbon-based compound in the range of about 0.005 to about 99.95 parts by weight based on 100 parts by weight of the hole transport layer.

6. The organic electroluminescent device of claim 1, further comprising:
a hole transport layer between the hole injection layer and the emission layer,
wherein the buffer layer is between one or more of the first electrode and the hole injection layer, the hole injection layer and the hole transport layer, and the hole transport layer and the emission layer.

7. The organic electroluminescent device of claim 6, wherein the buffer layer is between the first electrode and the hole injection layer.

8. The organic electroluminescent device of claim 7, wherein the buffer layer is between the first electrode and the hole injection layer and another buffer layer is between the hole injection layer and the hole transport layer.

9. The organic electroluminescent device of claim 6, wherein the buffer layer is between the hole injection layer and the hole transport layer.

10. The organic electroluminescent device of claim 9, wherein the hole transport layer includes the carbon-based compound in the range of about 0.005 to about 99.95 parts by weight based on 100 parts by weight of the hole transport layer.

11. The organic electroluminescent device of claim 1, further comprising:
a layer selected form the group of a hole blocking layer, an electron transport layer, and an electron injection layer,
wherein the layer is between the emission layer and the second electrode.

12. An organic electroluminescent device, comprising:
a first electrode;
a buffer layer comprised of a carbon-based compound on the first electrode;
an emission layer formed on the buffer layer;
a hole injection layer between the first electrode and the emission layer;
a hole transport layer between the hole injection layer and the emission layer;
an electron transport layer formed on the emission layer; and
a second electrode formed on the electron transport layer,
wherein the electron transport layer includes an electron transporting material and a carbon-based compound,
wherein the buffer layer is 0.1 nm to 100 nm thick, and
wherein the carbon-based compound includes fullerene, and
wherein the buffer layer is between the first electrode and the hole injection layer.

13. The organic electroluminescent device of claim 12, wherein the amount of the carbon-based compound in the electron transport layer is in the range of about 0.005 to about 99.95 parts by weight based on 100 parts by weight of the electron transport layer.

14. The organic electroluminescent device of claim 12, further comprising:
a second buffer layer comprising the carbon-based compound between one or more of the first electrode and the hole transport layer, and the hole injection layer and the hole transport layer.

15. An organic electroluminescent device, comprising:
a first electrode;
a buffer layer comprised of a carbon-based compound on the first electrode;
an emission layer formed on the buffer layer;
a hole injection layer between the first electrode and the emission layer;
a hole transport layer between the hole injection layer and the emission layer;
an electron transport layer formed on the emission layer; and
a second electrode formed on the electron transport layer,
wherein the electron transport layer includes an electron transporting material and a carbon-based compound,
wherein the buffer layer is 0.1 nm to 100 nm thick, and
wherein the carbon-based compound includes fullerene, and
wherein the buffer layer is between the hole injection layer and the hole transport layer.

16. The organic electroluminescent device of claim 15, further comprising:
a second buffer layer comprising the carbon-based compound between one or more of the first electrode and the hole transport layer, the first electrode and the hole injection layer.

17. The organic electroluminescent device of claim 12, further comprising:
an electron injection layer, a hole blocking layer, or both an electron injection layer and a hole blocking layer between the electron transport layer and the second electrode.

* * * * *